United States Patent
Fruth et al.

[11] Patent Number: 6,011,280
[45] Date of Patent: Jan. 4, 2000

[54] IGBT POWER DEVICE WITH IMPROVED RESISTANCE TO REVERSE POWER PULSES

[75] Inventors: John Rothgeb Fruth, Kokomo; Stephen Paul Barlow, Noblesville; Jerral Alan Long; Michael Joseph Huemmer, both of Kokomo, all of Ind.

[73] Assignee: Delco Electronics Corporation, Kokomo, Ind.

[21] Appl. No.: 09/105,610

[22] Filed: Jun. 26, 1998

[51] Int. Cl.[7] .......................... H01L 29/74; H01L 31/111
[52] U.S. Cl. ........................ 257/137; 257/138; 257/139
[58] Field of Search ................................ 257/307, 137, 257/138, 139

[56] References Cited

U.S. PATENT DOCUMENTS 5,585,651  12/1996  Kitagawa et al. .

FOREIGN PATENT DOCUMENTS 0494597  7/1992  European Pat. Off. .
0670601  9/1995  European Pat. Off. .

*Primary Examiner*—Stephen D. Meier
*Attorney, Agent, or Firm*—Jimmy L. Funke

[57] ABSTRACT

A semiconductor power device (100) that includes active cells in an interior region of an epitaxial layer (16) on a semiconductor substrate (12), and an edge termination structure that surrounds the cells and separates the cells from the die edge (48). A polysilicon layer (26) overlies and is electrically insulated from the epitaxial layer (16), a gate metal field plate (36) contacts the polysilicon layer (26), and a portion of the polysilicon layer (26) forms a gate for each cell. Each of the active cells also has a collector/anode terminal formed by the substrate (12), an emitter/cathode terminal formed by a well (18), emitter diffusion (20) and emitter metal (22), and a base formed by the epitaxial layer (16). The edge termination structure includes a first well (34) of a first conductivity type underlying the polysilicon layer (26) and completely surrounding the active cells, a second well (30) of an opposite conductivity completely surrounding the first well (34), and metallization (42) contacting the second well (30). The first well (34) is part of a low-voltage ring (28) while the second well (30) is part of a high-voltage ring. The wells (30, 34) are preferably spaced relative to each other and to the device edge (48) to provide ballast resistance through the epitaxial layer (16), such that a breakdown will not be able to generate enough localized current to damage or destroy the device (100) when a reverse power pulse is experienced.

16 Claims, 2 Drawing Sheets

IGBT POWER DEVICE WITH IMPROVED RESISTANCE TO REVERSE POWER PULSES

FIELD OF THE INVENTION

The present invention generally relates to semiconductor power devices. More particularly, this invention relates to an insulated gate bipolar transistor (IGBT) power device that exhibits improved resistance to reverse power pulses.

BACKGROUND OF THE INVENTION

Semiconductor power devices typically include thousands of identical "active" cells, such as double-diffused metal-oxide-semiconductor (DMOS) transistors or insulated gate bipolar transistors (IGBT). These transistors are capable of controlling large voltages and currents at their cathode and anode terminals.

Shown in FIG. 1 is a single IGBT cell located near the die edge 48 of a known IGBT power device 10. The power device 10 includes a P+ substrate (collector) 12, an N+ epitaxial buffer layer 14, and an N− epitaxial layer (base) 16. For each cell (of which there are usually many), a P–well (emitter) 18 is formed in the N− epitaxial layer 16. An N+island forms an emitter diffusion 20 in the P–well 18, and both are contacted by emitter metal 22 that overlies the entire device 10. A P+ island 24 is formed through the P–well 18 and into the N− epitaxial layer 16 to provide good ohmic contact between the emitter metal 22 and the P–well 18 and enhance the ruggedness of the device. Gate polysilicon 26 overlies but is electrically insulated by a gate oxide 44 from a region of the P–well 18 between the N+ emitter diffusion 20 and the N− epitaxial 16. The collector (P+ substrate) 12 is positively biased via collector metal 46, and the emitter (P–well 18, P+ island 24 and N+ emitter diffusion 20) is grounded. The base (N− epitaxial 16) of the power device 10 is not charged by any external means.

The power device 10 is turned on by applying a positive voltage to the gate polysilicon 26 via a gate metal field plate 36, which causes the surface of the P–well 18 beneath the gate polysilicon 26 to invert and form an n-type channel through which electrons flow from the grounded N+ emitter diffusion 20 toward the positively-biased P+ substrate 12. At this stage, the device 10 behaves as a MOSFET, with the N+ island (emitter diffusion 20) serving as the source, and the N− epitaxial layer 16 serving as the drain for electrons. In this mode, the cells of the device 10 have a common source (emitter metal 22), drain (N− epitaxial layer 16) and gate (gate polysilicon 26). As electrons cross the diode formed by the P+ substrate 12, N+ buffer layer 14 and N− epitaxial layer 16, the diode becomes forward biased (i.e., the N− epitaxial layer (base) 16 becomes negatively charged) and starts to inject holes from the P+ substrate 12 into the N− epitaxial layer 16. The holes are then drawn to the grounded P–well 18 and P+ island 24, thereby effectively turning the device 10 "on."

The IGBT power device 10 depicted in FIG. 1 is generally a punch-through device—the voltage at breakdown (and below) will "deplete" or punch all the way through the epitaxial layer 16—to reduce the thickness of the N− epitaxial layer 16 required to meet the forward blocking voltage requirement for the device. The device 10 is shown as having an edge termination structure that includes a low-voltage ring 28 a continuous high-voltage N+ well 30. The low-voltage ring 28 has a continuous P+ well 34 that underlies but is electrically insulated from the gate polysilicon 26 by a field oxide layer 38, such that the gate polysilicon also forms a gate terminal of the P+ well 34. A continuous high-voltage metal ring 42 contacts the N+ well 30 through the field oxide layer 38 and a low temperature oxide (LTO) layer 40 for the purpose of terminating the device 10, providing a channel stop, improving breakdown voltage and reducing leakage, and, for clamped devices, making contact to the high-voltage epitaxial layer 16.

The P+ well 34 and N+ well 30 are located near the edge of the die and completely encircle the cells of the power device 10. The N+ well 30 is spaced up to 50 micrometers, typically 20 μm, from the die edge 48, with the P+ well 34 being spaced about 200 μm from the N+ well 30. Because they are continuous, the N+ well 30 and particularly the P+ well 34 serve to reduce the high electric fields that occur in the sharp corners of the die. As such, the presence of the continuous P+ well 34 and N+ well 30 enables the device 10 to sustain high voltages when in the "off" state.

As stated above, in the forward direction the diode between the P+ substrate 12 and the N− epitaxial layer 16 (referred to here as the "substrate diode") is forward biased. In the reverse direction, a typical device of the type shown in FIG. 1 will have a breakdown voltage (BV) of about 20 V to 50 V. This provides voltage blocking, but only up to the breakdown voltage of the substrate diode. The ruggedness of the Power device 10 is generally defined as the ability of the device to resist failure when its breakdown voltage is exceeded. The active area of the power device 10 is surrounded by the edge termination structure (ring 28 and well 30) in order to increase the breakdown voltage of the device 10. However, many IGBT applications, such as automotive ignition systems, have reverse power transients or pulses that exceed the reverse breakdown voltage for the device 10, and these transients often have sufficient energy to cause the device 10 to be destroyed. The typical location for breakdown of the substrate diode is at the edge of the die, indicated by the reference number 32 in FIG. 1. Once current flows at this location, it continues up to the N +well 30 and then over to the emitter metal 22 through the P+ well 34 of the low-voltage ring 28.

In view of the above, an IGBT semiconductor power device is required that exhibits improved resistance to reverse power pulses.

SUMMARY OF THE INVENTION

It is an object of this invention to provide a semiconductor power device that exhibits improved resistance to reverse power pulses.

It is another object of this invention that such a power device includes an edge termination structure whose location relative to the edge of the device and whose internal spacing provide improved resistance to reverse power pulses.

In accordance with a preferred embodiment of this invention, these and other objects and advantages are accomplished as follows.

According to the present invention, there is provided a semiconductor power device that includes a number of active cells in an interior region of an epitaxial layer on a semiconductor substrate, and an edge termination structure that surrounds the cells and separates the cells from the die edge of the device. As is generally typical of IGBT semiconductor power devices, a semiconductor (e.g., polysilicon) layer overlies and is electrically insulated from the epitaxial layer, a gate metal field plate contacts the semiconductor layer, and a portion of the semiconductor layer forms a gate for each cell. Each of the active cells also has a collector/anode terminal formed by the substrate (which is of a first conductivity type), an emitter/cathode terminal, and a base formed by the epitaxial layer (which is of the opposite conductivity type).

The edge termination structure of this invention generally includes a first well of the first conductivity type underlying the semiconductor layer and completely surrounding the active cells, a second well of the opposite conductivity completely surrounding the first well, and metallization contacting the second well and electrically insulated from the semiconductor layer. The first well is part of a low-voltage ring while the second well is part of a high-voltage ring. The well of the low-voltage ring is preferably continuous and underlies but is electrically insulated from the gate of the device, thereby forming a gate terminal for the low-voltage ring. The wells of the low and high-voltage rings are preferably uniformly spaced apart from each other. A metal ring directly contacts the second well to complete the high-voltage ring.

According to the invention, the well of the high-voltage ring is spaced at least about 100 micrometers from the die edge, while the well of the low-voltage ring is spaced at least about 250 micrometers from the well of the high-voltage ring. As a result of the above, the wells of the edge termination structure of this invention are spaced much farther from the die edge than done previously in the art, which has practiced locating the wells and rings as close to the die edge as possible to minimize chip size and costs. In particular, the distance between the high-voltage ring has conventionally been based on allowing for the sawing operation to separate the die without contacting and damaging the metal ring that contacts the well of the high-voltage ring. The distance between the low-voltage ring and the high-voltage ring has conventionally been as small as possible while still being able to withstand the breakdown voltage, and has often been chosen to be slightly larger than the worst case depletion region spreading from the well of the low-voltage ring and a field plate overlying this well. The present invention is contrary to prior practice by significantly increasing these distances—roughly two to four times greater for the high-voltage ring—which has been determined to provide ballast resistance through the layer, such that a breakdown will not be able to generate enough localized current to damage or destroy the device when a reverse power pulse is experienced. The above structure yields an IGBT semiconductor power device that can have a breakdown voltage of about 20 to 50 volts while resisting reverse power pulses in excess of about 100 volts with time constants of about 60 milliseconds (corresponding to about 4000 millijoules at 150° C., as compared to typical energy levels of 200 to 400 millijoules withstood by prior art devices).

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 1:
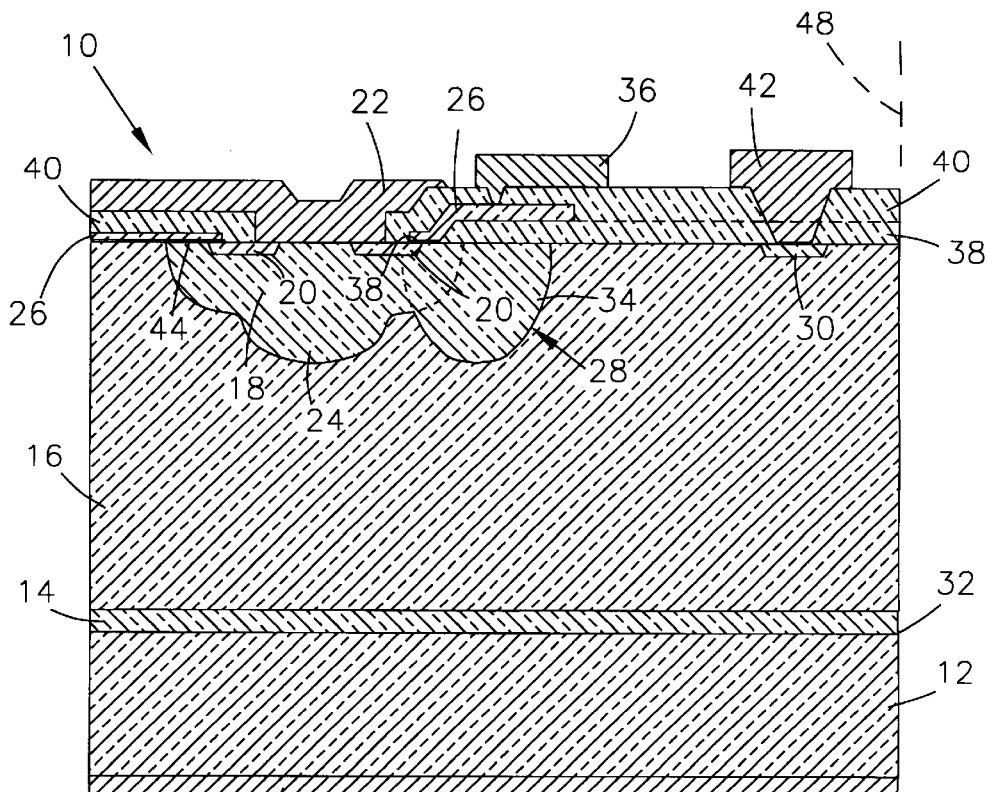
FIG. 1 is a cross-sectional view of an IGBT semiconductor power device provided with an edge termination structure in accordance with the prior art.
Figure 2:
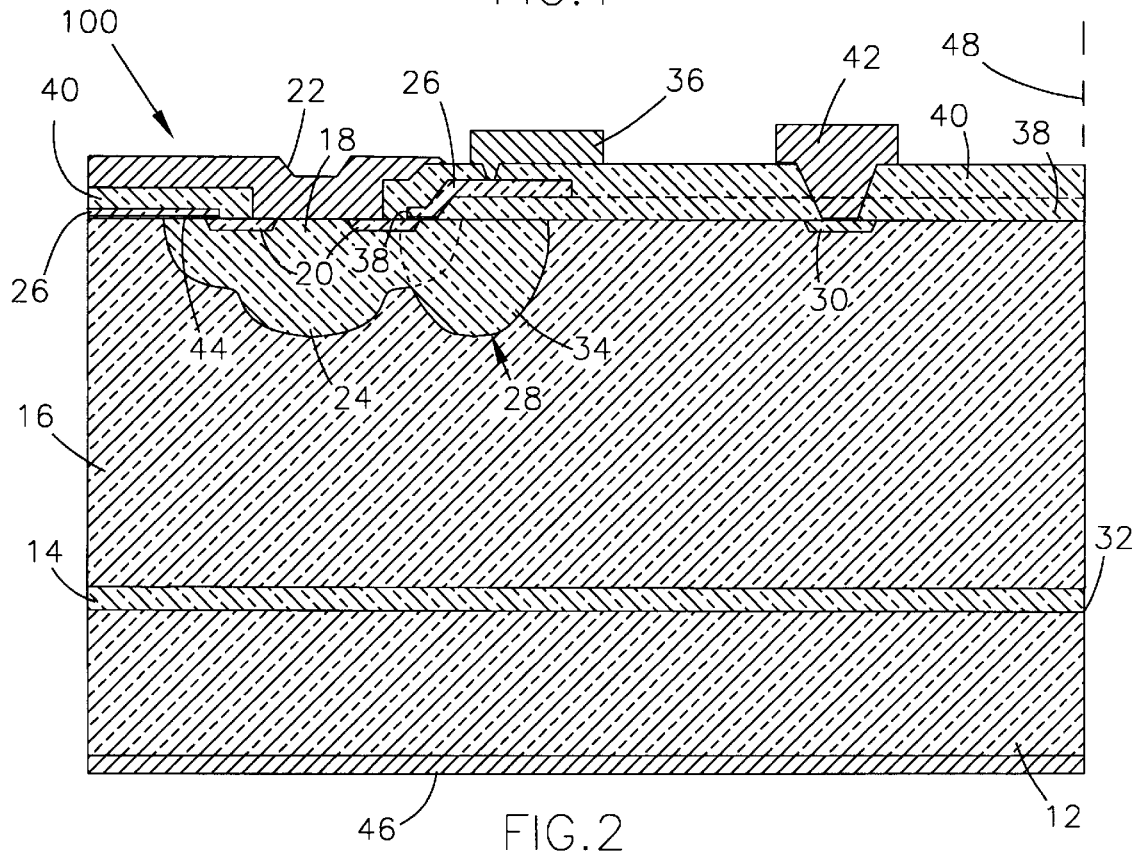
FIG. 2 is a cross-sectional view of an IGBT semiconductor power device in accordance with the present invention.

Illustrated in FIG. 2 is an IGBT semiconductor power device 100 that is configured in accordance with this invention, yet includes structures that can be essentially identical to those of the device 10 shown in FIG. 1. Consequently, the elements of the device 100 shown in FIG. 2 are numbered identically to the corresponding elements of FIG. 1. The differences between the devices 10 and 100 of FIGS. 1 and 2 are found within the edge termination formed by the low-voltage ring 28 and the continuous high-voltage N+ well 30, and particularly the relative locations of the N+ well 30 and the P+ well 34 of the low-voltage ring 28. According to this invention, the relative locations of these wells 30 and 34 provide ballast resistance through the epitaxial layer 16, such that a breakdown at point 32 at the die edge of the power device 100 will not be able to generate enough localized current to destroy the device 100 when subjected to a reverse power pulse of four joules or more.

In particular, the N+ well 30 is uniformly spaced at least 100 micrometers from the die edge 48, preferably about 120 to about 300 $\mu$m from the die edge 48, and most preferably about 120 $\mu$m from the die edge 48, while the P+ well 34 of the low-voltage ring 28 is uniformly spaced at least 250 $\mu$m from the N+ well 30, preferably about 300 to about 350 $\mu$m from the N+ well 30, and preferably about 300 $\mu$m from the N+ well 30. An interrelationship appears to exist between the distance between the N+ well 30 and edge 48 and the distance between the P+ well 34 and N+ well 30, in that a combined distance of about 400 $\mu$m, at least 100 $\mu$m of which is between the N+ well 30 and die edge 48, was required to obtain the benefits of the invention. In contrast, prior art practice is to minimize these distances, with the N+ well 30 of the device 10 of FIG. 1 being spaced about 20 $\mu$m from the die edge 48, and the P+ well 34 of the power device 10 being about 200 $\mu$m from the N+ well 30.

The solution provided by this invention to promote resistance to reverse power pulses resulted from tests performed which included different attempts to address this problem. For example, attempts were made to reduce the power dissipated during a reverse power pulse event by lowering the reverse breakdown voltage of a device, increase the reverse breakdown voltage to reduce current during a reverse power pulse, and remove the P+ well 34 in order to eliminate the pnp in the current path from the die edge 48 to the emitter metal 36, none of which proved to be effective. In addition, attempts to increase the reverse current path resistance from the die edge 48 to the emitter metal 36 included segmenting the metal ring 42, removing the N+ well 30 and metal ring 42, altering the distance between the P+ well 34 and the die edge 48, altering the distance between the N+ well 30 and the die edge 48, and combinations thereof. A matrix of the tested combinations evaluated with 165×165 mil (about 4×4 mm) dies is summarized in Table I below.

TABLE I

| SPECIMEN | "X" DISTANCE | "Y" DISTANCE | SEGMENT N+ METAL RING | REMOVE N+ RING |
|---|---|---|---|---|
| A | 30 | 210 | NO | NO |
| B | 120 | 210 | NO | NO |
| C | 210 | 210 | NO | NO |
| D | 30 | 300 | NO | NO |
| E | 30 | 390 | NO | NO |
| F | 120 | 300 | NO | NO |

TABLE I-continued

| SPECIMEN | "X" DISTANCE | "Y" DISTANCE | SEGMENT N+ METAL RING | REMOVE N+ RING |
|---|---|---|---|---|
| G | 30 | 210 | 50/50 | NO |
| H | 30 | 210 | 0/100 | NO |
| J | 120 | 210 | 50/50 | NO |
| K | 120 | 210 | 0/100 | NO |
| L | 30 | 210 | NO | YES |
| M | 120 | 210 | NO | YES |
| N | 300 | 210 | NO | NO |

Notes:
1. "'X' Distance" is the distance from the die edge 48 to the N+ well 30.
2. "'Y' Distance" is the distance from the P+ well 34 to the N+ well 30.
3. "Segment N+ Metal Ring" is denoted by the line/space length ratio of the metal ring 42 when segmented; "0/100" denotes removal of the N+ metal ring 42.
4. "Remove N+ Ring" denotes complete removal of the N+ well 30 and the metal ring 42.

These specimens underwent field decay testing that entailed the application of a reverse power pulse above the device breakdown voltage while the device is at a temperature of about 150° C. The reverse breakdown voltage of the specimens was about −35 V. The reverse pulse was about −100 V with a 60 ms time constant (energy of about 4000 mJ), causing a high current flow from the device substrate to the emitter metal.

Specimen A was a "standard" IGBT device with conventional spacing (about 30 µm) between the N+ well 30 and die edge 10 48, and conventional spacing (about 210 µm) between the P+ well 34 and N+ well 30. Specimens D, E, G, H and L also employed the same conventional spacing between the N + well 30 and die edge 48; Specimens B, C and G-N employed conventional spacing between the P+ well 34 and N+ well 30.

Figure 3:
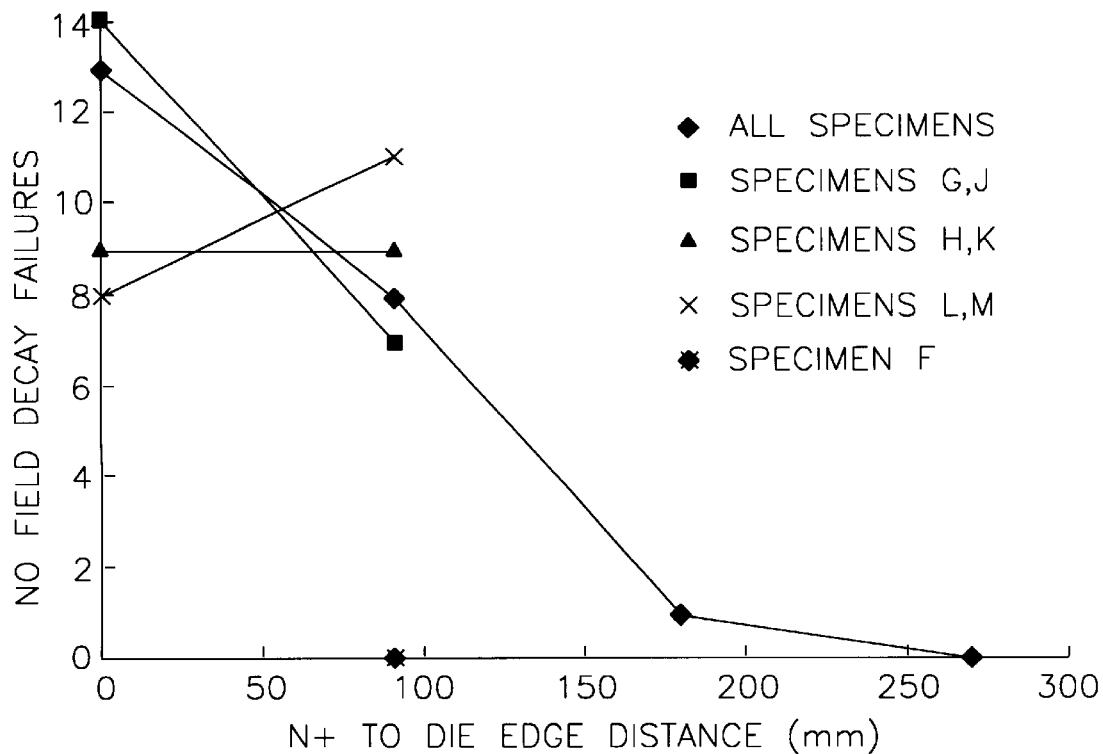
FIGS. 3 and 4 are graphs representing test data of IGBT power devices configured in accordance with the present invention and the prior art.

The effect of N+ well 30 location on field decay failure rates is represented in FIG. 3, which shows that as the distance between the N+ well 30 (and metal ring 42) and the die edge 48 increased, failure rates decreased. The varying effects that the evaluated modifications to the N+ metal ring 42 and N+ well 30 had on failure rates are also indicated in FIG. 3. The data point for Specimen F is singled out in FIG. 3, as it was the only tested specimen that did not exhibit any failures during testing.

Figure 4:
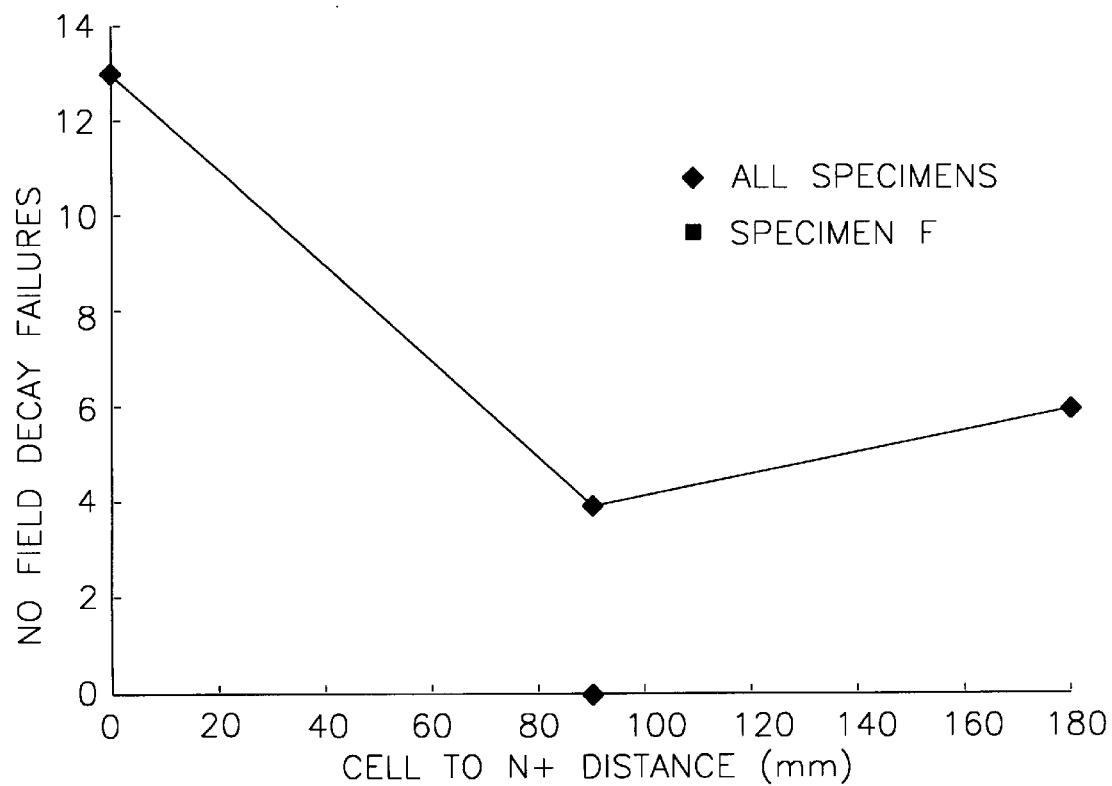

FIG. 4 illustrates the effect that the distance between P+ wells 34 and N+ wells 30 had on field decay failure rates. Again, the data for Specimen F is singled out because it was the minimum-sized test specimen that did not exhibit any failures during testing. Specimen N also had no failures, but required a larger total edge termination size. The spacing employed by Specimen F coincides with the optimal spacing suggested by the data represented in FIG. 4.

From the above results, it was concluded that improved resistance to a reverse power pulse is attained if the N+ well 30 is spaced at least 100 µm from the die edge 48, preferably about 120 µm to about 210 µm from the die edge 48, and most preferably about 120 µm from the die edge 48, while the P+ well 34 of the low-voltage ring 28 is at least 250 from the N+ well 30, preferably about 300 µm to about 350 µm from the N+ well 30, and most preferably about 300 µm from the N+ well 30.

According to the invention, IGBT semiconductor power devices of the type shown in FIG. 2 have a sufficiently high reverse current path resistance during breakdown to reduce reverse current flow to the extent that the devices are able to survive reverse current pulses that would destroy prior art devices of the type shown in FIG. 1. In addition to this operational advantage, it will be apparent to those skilled in the art that this invention does not require complicated fabrication techniques other than masking, implantation and diffusion techniques that are conventional to the art.

While the invention has been described in terms of a preferred embodiment, it is apparent that other forms could be adopted by one skilled in the art. For example, the device 100 could have additional edge termination structures, including a continuous floating well region, or field-limiting ring (FLR). Furthermore, the advantages of this invention are applicable to essentially any semiconductor power device with a substrate diode that is normally forward biased or with a P+ layer (e.g., substrate 12) in combination with an N+ buffer layer (e.g., buffer layer 14). Accordingly, the scope of the invention is to be limited only by the following claims.

What is claimed is:

1. A semiconductor power device comprising:

a semiconductor substrate of a first conductivity type;

an epitaxial layer on the substrate and having an interior region and a peripheral region surrounding the interior region so as to be between the interior region and a die edge of the semiconductor power device, the epitaxial layer having an opposite conductivity type to the first conductivity type;

a semiconductor layer overlying and electrically insulated from the epitaxial layer;

a first metallization electrically-contacting the semiconductor layer;

a plurality of active cells in the interior region of the epitaxial layer, each of the active cells having a collector/anode terminal, an emitter/cathode terminal, a gate terminal and a base, the gate terminal being formed by the semiconductor layer, the base being formed by the epitaxial layer;

an edge termination structure in the peripheral region of the epitaxial layer so as to be near the die edge of the semiconductor power device and surround the interior region of the epitaxial layer, the edge termination structure comprising:

a first well of the first conductivity type underlying the semiconductor layer and completely surrounding the interior region of the epitaxial layer;

a dielectric layer between a portion of the semiconductor layer and a portion of the first well so as to form a gate terminal of the edge termination structure;

a second well of the opposite conductivity completely surrounding the first well, the second well being electrically insulated from the semiconductor layer; and a second metallization contacting the second well and being electrically insulated from the semiconductor layer;

wherein the first well is spaced at least 250 µm from the second well and the second well is spaced at least 100 µm from the die edge of the semiconductor power device.

2. A semiconductor power device as recited in claim 1 wherein the first well is a continuous well.

3. A semiconductor power device as recited in claim 1 wherein the second well is a continuous well.

4. A semiconductor power device as recited in claim 1 wherein the substrate and the first well are p-type, and the epitaxial layer and second well are n-type.

5. A semiconductor power device as recited in claim 1 wherein the first well is spaced about 300 to about 350 μm from the second well.

6. A semiconductor power device as recited in claim 1 wherein the second well is spaced about 120 to about 210 μm from the die edge.

7. A semiconductor power device as recited in claim 1 wherein the first well is spaced about 300 μm from the second well.

8. A semiconductor power device as recited in claim 1 wherein the second well is spaced about 120 μm from the die edge.

9. A semiconductor power device as recited in claim 1 wherein the first well is spaced apart from the second well a substantially constant distance.

10. A semiconductor power device as recited in claim 1 wherein the second metallization is a continuous metal ring in the peripheral region of the epitaxial layer and completely surrounds the interior region of the epitaxial layer.

11. An IGBT semiconductor power device comprising:
   a p-type semiconductor substrate;
   a collector metallization contacting the substrate;
   an n-type epitaxial layer on the substrate and having an interior region and a peripheral region surrounding the interior region so as to be between the interior region and a die edge of the IGBT semiconductor power device;
   a polysilicon layer overlying and electrically insulated from the epitaxial layer;
   an emitter metallization electrically-contacting the semiconductor layer;
   a plurality of active cells in the interior region of the epitaxial layer, each of the active cells having a collector/anode terminal formed by the collector metallization, an emitter/cathode terminal formed by the emitter metallization, a gate terminal formed by the polysilicon layer, and a base formed by the epitaxial layer;
   an edge termination structure in the peripheral region of the epitaxial layer so as to be near the die edge of the IGBT semiconductor power device and surround the interior region of the epitaxial layer, the edge termination structure comprising:
   a low-voltage ring comprising a continuous P+ well underlying the polysilicon layer and completely surrounding the interior region of the epitaxial layer;
   a dielectric layer between a portion of the polysilicon layer and a portion of the P+ well so as to form a gate terminal of the low-voltage ring;
   a continuous N+ well completely surrounding the P+ well, the N+ well being electrically insulated from the polysilicon layer; and
   a metal ring contacting the N+ well and being electrically insulated from the polysilicon layer;
   wherein the P+ well is spaced about 300 to about 350 μm from the N+ well and the N+ well is spaced about 120 to about 210 μm from the die edge of the IGBT semiconductor power device.

12. An IGBT semiconductor power device as recited in claim 11 wherein each of the plurality of active cells comprises a P−well in the epitaxial layer and an N+ island in the well, the p+well separating the N+ island from the epitaxial layer, the emitter metallization electrically-contacting the N+ island and the P−well, the gate terminal overlying and being electrically insulated from the P−well.

13. An IGBT semiconductor power device as recited in claim 11, wherein the metal ring is continuous and completely surrounds the interior region of the epitaxial layer.

14. An IGBT semiconductor power device as recited in claim 11 wherein the P+ well is spaced about 300 μm from the N+ well.

15. An IGBT semiconductor power device as recited in claim 11, wherein the N+ well is spaced about 120 μm from the die edge.

16. An IGBT semiconductor power device as recited in claim 11, wherein the P+ well is spaced apart from the N+ well a substantially constant distance.

* * * * *

UNITED STATES PATENT AND TRADEMARK OFFICE
CERTIFICATE OF CORRECTION

| | | |
|---|---|---|
| PATENT NO. | : 6,011,280 | Page 1 of 1 |
| APPLICATION NO. | : 09/105610 | |
| DATED | : January 4, 2000 | |
| INVENTOR(S) | : John Rothgeb Fruth et al. | |

It is certified that error appears in the above-identified patent and that said Letters Patent is hereby corrected as shown below:

Title page,
Item [56], References Cited, insert the following U.S. PATENT DOCUMENTS:
-- 5,475,243 A   12/1995      Saito           257/171
   5,510,634 A   4/1996       Okabe et al.    257/139
   5,723,882 A   3/1998       Okabe et al.    257/139 --

Item [56], References Cited, insert the following FOREIGN PATENT DOCUMENTS:
-- EP    0485059         5/1992
   WO    91/017570 A1    11/1991 --

Signed and Sealed this

Twenty-second Day of May, 2012

David J. Kappos
*Director of the United States Patent and Trademark Office*